United States Patent [19]

Sauer

[11] Patent Number: 4,989,003
[45] Date of Patent: Jan. 29, 1991

[54] AUTOZEROED SET COMPARATOR CIRCUITRY

[75] Inventor: Donald J. Sauer, Allentown, N.J.

[73] Assignee: RCA Corporation, Princeton, N.J.

[21] Appl. No.: 367,836

[22] Filed: Jun. 19, 1989

[51] Int. Cl.[5] ............................................ H03K 5/153
[52] U.S. Cl. .................................... 341/136; 307/362
[58] Field of Search ....................... 341/136, 158, 172; 307/362

[56] References Cited

U.S. PATENT DOCUMENTS

| | | | |
|---|---|---|---|
| 4,262,221 | 4/1981 | Dingwall | 307/362 |
| 4,532,438 | 7/1985 | Reiner | 307/362 |
| 4,535,257 | 8/1985 | Hareyama | 307/362 |
| 4,547,683 | 10/1985 | Bingham | 307/355 |
| 4,598,215 | 7/1986 | Schechtman et al. | 307/362 |
| 4,667,180 | 5/1987 | Robinson | 340/347 |
| 4,691,189 | 9/1987 | Dingwall | 340/347 |
| 4,845,383 | 7/1989 | Iida | 341/136 |

OTHER PUBLICATIONS

Sn. 137,230, filed 12/23/87 by D. J. Sauer entitled "A Switched Capacitor Arrangement".
Sn. 07/329,162 filed 03/27/89 by D. J. Sauer entitled "Comparator Circuitry".
Yee et al., "A 1 mu MOS Comparator", IEEE Journal of Solid State Circuits, vol. SC-13, No. 3, Jun. 1978, p. 294.
IBM Technical Disclosure Bulletin, vol. 29, No. 1, Jun. 86, "High Speed, High Sensitivity Comparator".

Primary Examiner—William M. Shoop, Jr.
Assistant Examiner—Marc S. Hoff
Attorney, Agent, or Firm—Joseph S. Tripoli; Eric P. Herrmann; James B. Hayes

[57] ABSTRACT

A comparator circuit for operation at video rate signals includes input switches to alternately couple a reference and a signal potential to a summing capacitor. The capacitor is coupled to the input of a first inverting amplifier. The amplifier includes a switch between input and output terminals for selectively autozeroing the amplifier. The amplifier is direct coupled to the input of a second inverting amplifier having an autozero circuit exclusive of a connection to the input of the second amplifier. Timing circuitry for controlling the autozero function is arranged to minimize the effects of clocking transients upsetting the autozeroed potentials thereby reducing the response time and enhancing the sensitivity of the comparator.

11 Claims, 4 Drawing Sheets

AUTOZEROED SET COMPARATOR CIRCUITRY

This invention relates to comparator circuitry as for an analog-to-digital comparator.

BACKGROUND OF THE INVENTION

Digital circuit technology has been developed to the point where it is practical to begin implementing digital signal processing in consumer electronic apparatus. For example, manufacturers are beginning to introduce television receivers and video cassette recorders which incorporate digital electronics to add special features such as freeze frame or picture-in-picture to the receivers. In order to accomplish digital processing it is first necessary to convert the received broadcast signal to digital format, and this function is performed by an analog-to-digital converter (ADC) In digital television signal processing it is desirable to sample the television signal at a rate of four times the color subcarrier frequency (about 14.32 MHz), and convert the signal to pulse code modulated (PCM) format with 8-bit resolution. Bipolar ADC's exist which operate satisfactorily at these rates and resolution; however, the technology of choice of performing digital processing in electronic products is metal-oxide-semiconductor (MOS) field effect transistor (FET) technology. The reason is that MOSFET technology permits dense packing of devices with low power dissipation.

Prior art 8-bit 14 MHz ADC's implemented in MOS technology are currently available; however production yields of such devices are relatively poor. An example of a typical MOS ADC is described in U.S. Pat. No. 4,691,189, which is incorporated herein by reference Numerous variants of this type of ADC have been designed to increase either its operating speed or its conversion linearity. However, these designs do not provide apparatus with satisfactory performance/yields for video rate signal processing. In the ADC's of the type illustrated in U.S. Pat. No. 4,691,189 performance is traded off against yield, in that the transistor sizes are made extremely small to increase packing density and thereby yield However, as transistor devices are made smaller, stray capacitances become increasingly more significant, which stray capacitances adversely affect circuit performance. In addition the stray capacitances in MOS circuitry tend to be non-linear with applied potential and therefore are not completely predictable.

The comparator circuitry described in U.S. Pat. No. 4,691,189, a portion of which is illustrated in FIG. 1 herein, utilizes two inverting amplifier stages 11, 12 which are capacitively coupled (C2) in cascade, and each of which includes switching circuitry (TG1, TG2) for autozeroing during a portion of each sample period. The coupling capacitance C2 inherently includes a stray capacitance between one of its plates and the circuit substrate, which stray capacitance is of the same order of magnitude as the coupling capacitance itself. This stray capacitance will slow the response time at the output of the first inverting amplifier and thereby slow the response time of the comparator.

In the comparator design of U.S. Pat. No. 4,691,189 the inverting amplifiers I1, I2 are designed with complementary FET's having a common gate connection and their drain-source conduction paths are serially coupled between supply potentials The autozeroing switches are arranged to connect the output terminals of the inverting amplifiers to their respective input terminals, immediately prior to each signal sampling interval. This form of autozeroing renders the inverting amplifiers sensitive to very slight changes of input potential (a desirable characteristic for this type of comparator).

For every comparator in the ADC, and there may be 256 comparators in an 8-bit flash ADC, at least all of the second inverting amplifiers I2 will exhibit a saturated output potential each sample period, requiring a significant potential change during autozero. It will be recognized that the speed at which the inverting amplifiers can autozero is adversely affected by the stray capacitance in the circuit, for example the stray capacitances between C1 and C2 and substrate and the stray capacitances between the autozero switching circuits (TG1, TG2) and substrate.

It is an object of this invention to provide an MOS comparator circuit with performance/yield characteristics suitable for video rate ADC circuitry.

SUMMARY OF THE INVENTION

The present invention is a comparator circuit including first and second common source amplifiers direct coupled in cascade. Each of the common source amplifiers include respective autozeroing circuitry and input signal is coupled to an input terminal of said first common source amplifier via a capacitor.

DETAILED DESCRIPTION

Referring to the prior art circuitry of FIG. 1 a brief description of its operation will be given. During a first half of each sample period, switching circuits TG1 and TG2 respectively short circuit the input and output connections of inverting amplifiers I1 and I2. This establishes the input potential of each amplifier midway between its dynamic operating range. These potentials are stored on respective plates of capacitors C1 and C2. At the same time switching circuits TG1 and TG2 are short circuited, switching circuit TGR is also short circuited coupling a reference potential to the input plate of capacitor C1. Switching circuits TG1, TG2 and TGR are then simultaneously open circuited. Amplifiers I1 and I2 have significant gain and are now biased at an unstable operating point.

Switching circuit TGS is then short circuited, coupling the input potential to the plate of capacitor C1. If the input potential is very slightly greater (lesser) than the reference potential the output potential from inverting amplifier I2 will be driven to substantially its positive (negative) output saturation level and thereafter stored in the latch circuitry for a sample period. For a more detailed description of the operation of this circuitry see U.S. Pat. No. 4,691,189.

Figure 1:
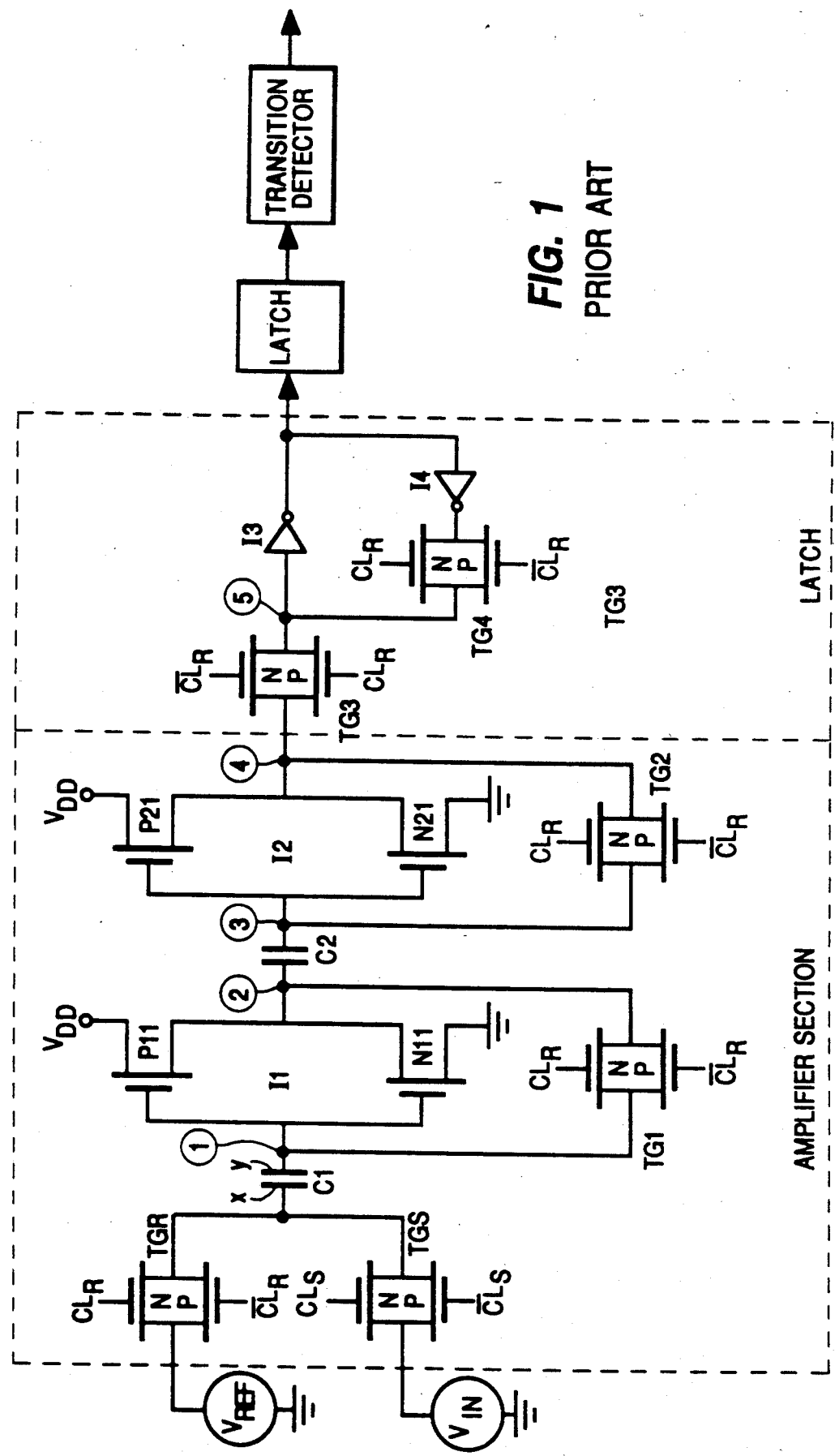
FIG. 1 is a schematic diagram of a prior art comparator circuit.
Figure 2:
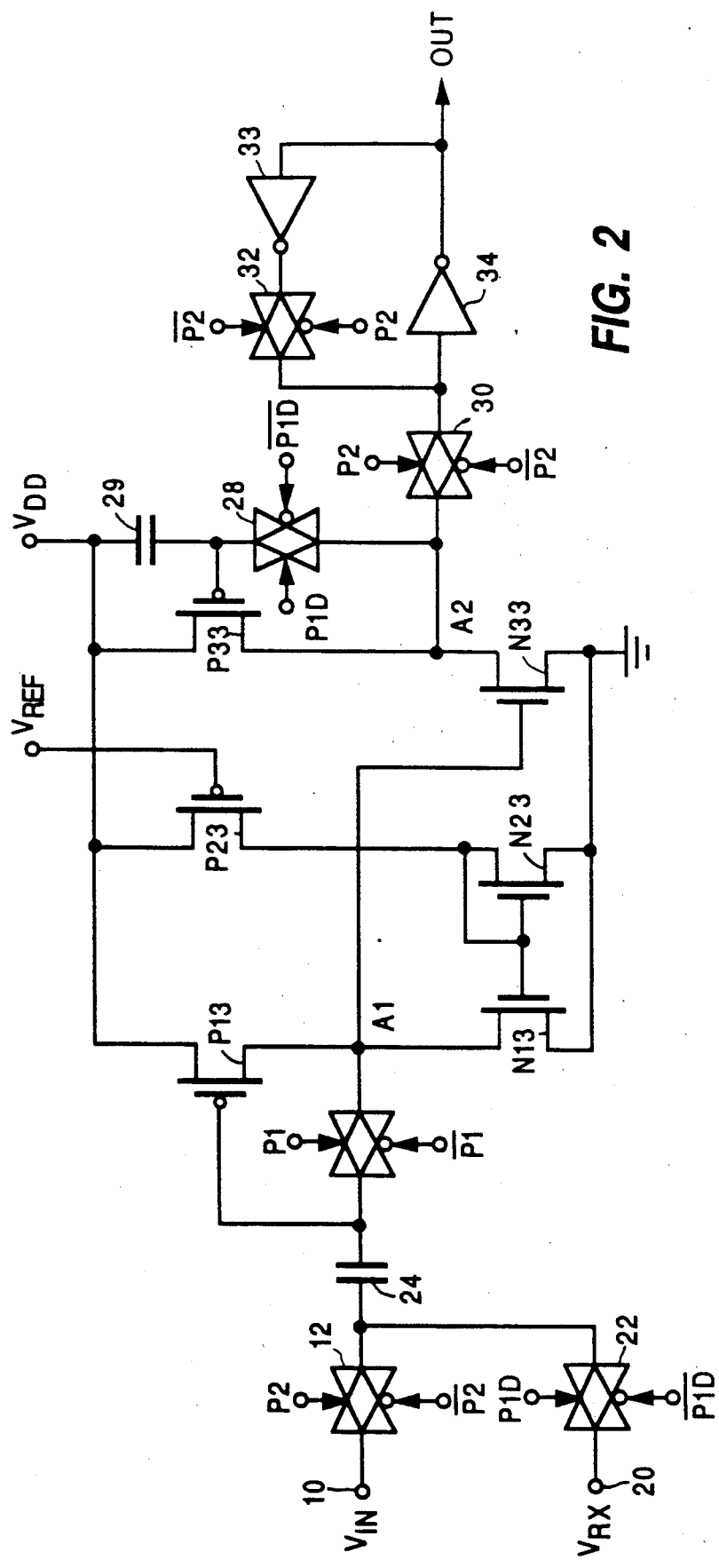
FIG. 2 is a schematic diagram of comparator circuitry embodying the present invention.

Refer now to the FIG. 2 circuitry which operates similarly to the FIG. 1 circuitry, but is arranged for faster operating performance. In FIG. 2 elements 12, 22, 26, 28, 30 and 32 are switching circuits and may be realized with complementary transistor transmission gates such as the switching circuits TG1 and TG2 in FIG. 1.

Input signal to be compared is coupled via a terminal 10 to a switching circuit 12. Reference signal against which the input signal is to be compared is coupled via a terminal 20 to a switching circuit 22. Switching circuits 12 and 22 are conditioned by substantially antiphase clock signals P2 and P1D to alternately couple the input and reference signals to a first plate of an input capacitor 24. A second plate of the capacitor 24 is coupled to the gate electrode of a p-type transistor P13 biased as a common source amplifier A1. An n-type transistor N13, biased as a constant current source, has its drain electrode coupled to the drain electrode of transistor P13 and forms a load impedance for the amplifier. The interconnection of transistors N13 and P13 is the output connection of the common source amplifier. A switching circuit 26 is coupled between the input and output connections of the common source amplifier. Switching circuit 26 is conditioned by a clocking signal P1 to autozero the amplifier stage substantially coincident with switching circuit 22 coupling the reference signal to capacitor 24. See FIG. 3 for the relative timing of clocking signals P1, P2 and P1D.

Bias potential for the n-type transistor N13 is provided by a p-type transistor P23 and an n-type transistor N23 having their respective principal conduction paths connected in series between the supply potentials. Transistor N23 is coupled as the master transistor of a current mirror amplifier with transistor N13 coupled as the slave transistor. The control electrode of a transistor P23 is biased at a potential which is about midway between the supply potentials. The ratio of transconductances P23/N23 of transistors P23, N23, is equal to the ratio of transconductances P13/N13 of transistors P13 and N13.

The output connection of the amplifier A1 is connected to the control electrode of a further n-type transistor N33 connected as a common source amplifier A2. The load circuit for transistor N33 is provided by a p-type transistor P33 having its drain/source conduction path coupled in series with the drain/source conduction path of transistor N33 between the supply potentials $V_{DD}$ and ground. The interconnection of transistors P33 and N33 forms an output connection of the amplifier A2.

The control electrode of transistor P33 is connected to the output connection of amplifier A2 by the switching circuit 28. The switching circuit is controlled by the clock signal P1D. During the intervals that switching circuit 26 couples the input and output connections of amplifier A1 in order to autozero amplifier A1, switching circuit 28 couples the output connection of amplifier A2 to the gate electrode of transistor P33 in order to autozero amplifier A2.

A capacitor 29 is coupled between the control electrode of transistor P33 and a point of fixed potential, e.g., supply potential $V_{DD}$ or ground potential. Capacitor 29 may be designed into the circuit or it may consist of stray capacitance. The capacitor 29 is incorporated to store the autozero bias potential and apply same to the control electrode of transistor P33 when the switching circuit 28 is open circuited.

Circuit elements 30, 32, 33 and 34 coupled to the output connection of amplifier A2 form a conventional latch circuit to store the results of each comparison for at least one-half of the subsequent sample period.

Nominally switching circuits 26 and 28 may be controlled by the same clock signals. In a preferred embodiment however, switching circuit 28 will remain closed or short circuited for a short period after switching circuit 26 has been open circuited. The reason is as follows. Consider capacitors 24 and 29 to have the same capacitance value, and transistors P13 and P33 to be complementary to transistors N13 and N33. Under this set of circumstances transistors P13, P33 and N33 will exhibit a like magnitude of gain. Also consider switching circuits 26 and 28 to be similar in construction. Switching circuits 26 and 28, due to inherent stray capacitances between their control electrodes and their respective input/output terminals, will couple a portion of the clock signal transients to the control electrodes of transistors P13 and P33 when the switching circuits are open circuited at the termination of the autozero interval. Assume that the gain of amplifier A1 is "$-A$", that the gain of amplifier A2 relative to potentials applied to the control electrode of transistor N33 is "$-A$", and that the gain of amplifier A2 relative to signals applied to transistor P33 is "$-A$". Assume also that switching circuits 26 and 28 simultaneously couple a potential $\Delta V$ to the control electrodes of transistors P13 and P33 due to clocking transients. The potential $\Delta V$ will create a change in the autozeroed output potentials of amplifiers A1 and A2 equal to $-A\Delta V$ and $\Delta VA(A-1) \sim \Delta VA^2$, respectively. One of the implications of this potential change is that at least for output potential swings in the opposite direction, due to a signal comparison, the output at amplifier A2 must go through an added potential excursion of $\Delta VA^2$ volts, thereby slowing the response time of the circuit. A second ramification is a reduction in sensitivity.

Alternatively, if switching circuit 28 is held on when switching circuit 26 is turned off, amplifier A2 will autozero despite a change in the autozeroed potential of amplifier A1. Thereafter when switching circuit 28 is open circuited, a change of only $A\Delta V$ will occur in the autozeroed output potential of amplifier A2. In this mode of operation the system response time and sensitivity are adversely affected to a significantly lesser extent.

The input to amplifier A2 is direct coupled to the output of amplifier A1 which provides two significant advantages over the capacitive coupling of the prior art circuit of FIG. 1. First the stray capacitance to ground, (i.e., substrate) at the output connection of amplifier A1, is reduced thereby enhancing the response time of the circuitry. Secondly, the control electrode of transistor N33 (and transistors N21 and P21 of FIG. 1) presents a capacitive load, C, to the output of amplifier A1 (I1). If amplifier A1 were capacitively coupled (by a capacitance $C_c$) to transistor N13, a division of the output potential $V_{A1}$, from amplifier A1 would occur. The potential applied to transistor N13 would be reduced to $V_{A1}C_c/(C_c+C)$, which reduction would tend to undesirably increase the response time and reduce the sensitivity of the circuit. Thus elimination of the coupling capacitor between the amplifier stages provides significant advantages.

A further advantage of the present invention lies in the positioning of the autozero switching circuit 28. Note in the prior art circuit that during the autozeroing interval the output of amplifier I2 is coupled to the input of amplifier I1 via switching circuits TG1, TG2 and capacitor C2. This connection tends to provide regenerative feedback around the two amplifiers, slowing the autozero response time of the prior art system. In the embodiment of FIG. 2, regenerative feedback is precluded as no circuit path is provided between the input connection of amplifier A1 and the output connection of amplifier A2.

In the FIG. 2 circuitry several alterations may be made. For example, the output of amplifier A1 may be coupled to the control electrode of transistor, P33 and the switching circuit 28 coupled between the output of amplifier A2 and the control electrode of N33. Alternatively the input to amplifier A1 may be coupled to transistor N13 with transistor P13 operated as a current source load device. Also consider a large number of the FIG. 2 type comparator circuits coupled to a common input terminal as in a flash ADC. In this instance each of the input connections 20 will be coupled to a different reference voltage incrementally ascending over a range of from ground to supply potential. Assume that the average or D.C. value of the signal applied to the common input terminal is one-half the supply voltage. In this instance it is desirable to fashion all of the comparator circuits coupled to reference potentials greater than one-half the supply potential as shown in FIG. 2, and all of the comparator circuits coupled to reference potentials less than one-half the supply potential fashioned complementary to the FIG. 2 circuitry, or vice versa. (By complementary it is meant that the inputs to amplifiers A1 and A2 are coupled to the control electrodes of transistors N13 and P33, respectively, etc.)

In a still further embodiment, the first inverting amplifier A1 in the FIG. 2 circuitry may be replaced with an inverting amplifier such as the amplifier I1 illustrated in the FIG. 1 circuitry. In this embodiment the control or gate electrode of transistor N33 is direct coupled to the interconnection of transistors P11 and N11, and transistors P23 and N23 are eliminated.

Figure 3:
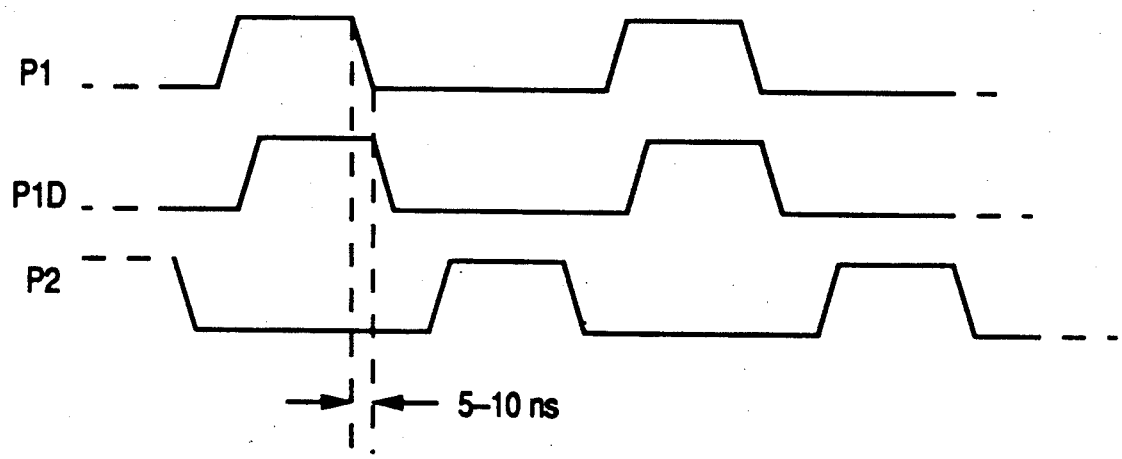
FIG. 3 illustrates clocking waveforms useful in describing the operation of the FIG. 2 circuitry.

FIG. 3 shows the preferred timing of the clock signals applied to control the switching circuits. Desirably clock signals P1 and P2 are antiphase non-overlapping signals.

Figure 4:
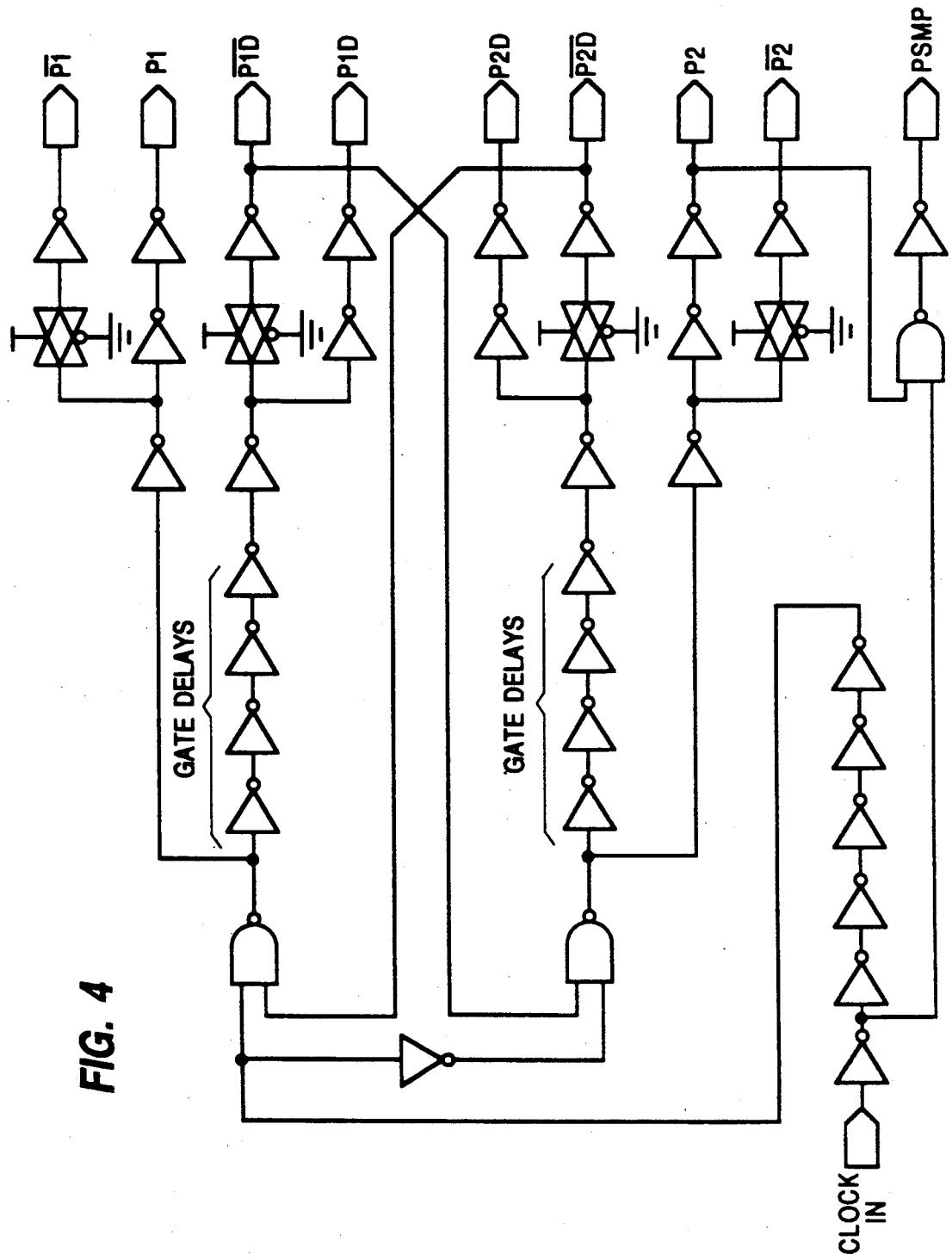
FIG. 4 illustrates exemplary circuitry for generating the clock signals illustrated in FIG. 3.

FIG. 4 illustrates exemplary circuitry for generating the clock signals shown in FIG. 3. Those persons skilled in the art of circuit design will readily understand the operation of this circuitry and therefore it will not be described in detail. Suffice it to say that the delayed signal P1D is produced by generating a delayed version of the signal P1. In FIG. 4 this delay is realized via the inherent delay of series connected gate circuits (e.g., 4 inverter circuits).

What is claimed is:

1. Comparator apparatus comprising:
   first and second input-terminals for applying first and second signals to be compared;
   a first capacitor having a first plate and a second plate;
   first switch means for alternately coupling said first and second input terminals to said first plate;
   a current source;
   a first transistor having a control electrode coupled to said second plate, and a principal conduction path coupled in series with said current source, said current source and said first transistor forming a common source type amplifier having an output connection;
   second switch means for alternately coupling and decoupling the output connection of said common source type amplifier to said control electrode of said first transistor;
   a second transistor having a control electrode direct coupled to the output connection of said common source type amplifier and having a principal conduction path;
   a third transistor having a control electrode, and a principal conduction path, the principal conduction paths of said second and third transistors being serially coupled to form a further common source type amplifier having an output connection;
   a second capacitor having a first plate coupled to a point of fixed potential and a second plate coupled to the control electrode of said third transistor;
   third switch means for alternately coupling and decoupling the output connection of said further common source type amplifier to the control electrode of said third transistor to sequentially auto zero said further common source amplifier.

2. The comparator set forth in claim 1 wherein said first and third transistors are of a first conductivity type and said second transistor is of a second opposite conductivity type.

3. The comparator set forth in claim 1 further including means to condition said third switch means to couple the output connection of the further common source type amplifier to the control electrode of said third transistor and to substantially concurrently condition said second switch means to couple the output connection of said common source type amplifier to the control electrode of said first transistor 4. The comparator apparatus set forth in claim 3 wherein said third switch means is conditioned to couple the output connection of said further common source type amplifier to the control electrode of said third transistor for an interval after said second switch means decouples the output connection of said common source type amplifier from the control electrode of said first transistor.

5. The comparator apparatus set forth in claim 4 wherein said first switch means is conditioned to couple said second input terminal to said first plate concurrently with said third switch means coupling the output connection of said further common source type amplifier to the control electrode of said third transistor.

6. A comparator comprising:
   first and second signal input terminals for applying a signal potential and a reference potential respectively;
   a capacitor having first and second terminals;
   first switch means for alternately coupling said first and second signal input terminals to the first terminal of said capacitor;
   a first inverting amplifier having an input terminal coupled to the second terminal of said capacitor and having an output terminal;
   second switch means for alternately coupling and decoupling the input and output terminals of said first inverting amplifier;
   a second inverting amplifier having a signal input terminal direct coupled to the output terminal of the first amplifier and having an output terminal; and
   means for selectively autozeroing said second inverting amplifier, said means exclusive of any connection to the signal input terminal of said second inverting amplifier.

7. The comparator set forth in claim 6 wherein said second inverting amplifier comprises:

a first transistor having first and second electrodes with a principal conduction path therebetween, and a control electrode coupled to the output terminal of said first inverting amplifier;

a second transistor having first and second electrodes with a principal conduction path therebetween, and having a control electrode, and wherein the principal conduction paths of said first and second transistors are connected in series, an interconnection of said first and second transistors forming said output terminal of said second inverting amplifier; and wherein said means for autozeroing said second inverting amplifier includes a third switch means for alternately connecting and disconnecting the output terminal of said second inverting amplifier to the control electrode of said second transistor.

8. The comparator set forth in claim 7 wherein said third switch means is conditioned to couple the output terminal of said second inverting amplifier to the control electrode of said second transistor substantially concurrently with said second switch means coupling the input and output terminals of said first inverting amplifier but wherein said third switch means is conditioned to couple the output terminal of said second inverting amplifier to the control terminal of said second transistor for an interval after said second switch means decouples the input and output terminals of said first inverting amplifier.

9. The comparator set forth in claim 7 wherein said first and second transistors are complementary conductivity type transistors.

10. A comparator comprising:
first and second signal input terminals for applying a signal potential and a reference potential respectively;
a capacitor having first and second terminals;
first switch means for alternately coupling said first and second signal input terminals to the first terminal of said capacitor;
an inverting amplifier having an input terminal coupled to the second terminal of said capacitor and having an output terminal;

second switch means for alternately coupling and decoupling the input and output terminals of said inverting amplifier;

a first transistor having first and second electrodes with a principal conduction path therebetween, and a control electrode continuously galvanically coupled to the output terminal of said inverting amplifier;

a second transistor having first and second electrodes with a principal conduction therebetween, and having a control electrode, and wherein the principal conduction paths of said first and second transistors are connected in series, an interconnection of said first and second transistors forming an output terminal of a further inverting amplifier;

a third switch means for alternately connecting and disconnecting said output terminal of said further inverting amplifier to the control electrode of said second transistor for selectively autozeroing said further inverting amplifier; and a capacitor coupled between the control electrode of said second transistor and a point of fixed potential.

11. In combination:
a signal input terminal;
a capacitor having a first terminal coupled to said signal input terminal and having a second terminal;
a first inverting amplifier having an input terminal coupled to the second terminal of said capacitor and having an output terminal;
switch means for alternately coupling and decoupling the input and output terminals of said first inverting amplifier for autozeroing said first inverting amplifier;
a second inverting amplifier having a signal input terminal direct coupled to the output terminal of the first inverting amplifier, and having an output terminal; and
means for selectively autozeroing said second inverting amplifier substantially concurrently with autozeroing said first inverting amplifier, said means exclusive of any connection to the signal input terminal of said second inverting amplifier.

* * * * *

UNITED STATES PATENT AND TRADEMARK OFFICE
CERTIFICATE OF CORRECTION

PATENT NO. : 4,989,003

DATED : January 29, 1991

INVENTOR(S) : Donald Jon Sauer

It is certified that error appears in the above-identified patent and that said Letters Patent is hereby corrected as shown below:

On the title page, Item [54] "SET" should read --FET--.

Column 1, line 2, "SET" should read --FET--.

Signed and Sealed this

Ninth Day of June, 1992

Attest:

DOUGLAS B. COMER

*Attesting Officer*  *Acting Commissioner of Patents and Trademarks*

UNITED STATES PATENT AND TRADEMARK OFFICE
CERTIFICATE OF CORRECTION

PATENT NO. : 4,989,003

DATED : January 29, 1991

INVENTOR(S) : Donald J. Sauer

It is certified that error appears in the above-identified patent and that said Letters Patent is hereby corrected as shown below:

On the title page, Item [73] Assignee: "RCA Corporation"
should read
--RCA Licensing Corporation--.

Signed and Sealed this

Eleventh Day of August, 1992

Attest:

DOUGLAS B. COMER

*Attesting Officer*  *Acting Commissioner of Patents and Trademarks*